(12) United States Patent
Kong et al.

(10) Patent No.: US 9,905,705 B2
(45) Date of Patent: Feb. 27, 2018

(54) THIN FILM TRANSISTOR, ARRAY SUBSTRATE AND DISPLAY DEVICE

(71) Applicant: BOE TECHNOLOGY GROUP CO., LTD., Beijing (CN)

(72) Inventors: Xiangchun Kong, Beijing (CN); Zhanfeng Cao, Beijing (CN); Wei Zhang, Beijing (CN); Bin Zhang, Beijing (CN); Xiaolong He, Beijing (CN); Jincheng Gao, Beijing (CN); Qi Yao, Beijing (CN); Zhengliang Li, Beijing (CN); Chuanxiang Xu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/096,807

(22) Filed: Apr. 12, 2016

(65) Prior Publication Data

US 2016/0380114 A1    Dec. 29, 2016

(30) Foreign Application Priority Data

Jun. 25, 2015  (CN) .......................... 2015 1 0358095

(51) Int. Cl.
*H01L 27/14*   (2006.01)
*H01L 29/04*   (2006.01)
*H01L 29/15*   (2006.01)
*H01L 31/036*  (2006.01)
*H01L 29/786*  (2006.01)
*H01L 27/12*   (2006.01)
*G02F 1/1368*  (2006.01)

(Continued)

(52) U.S. Cl.
CPC ...... *H01L 29/78696* (2013.01); *G02F 1/1368* (2013.01); *G02F 1/134309* (2013.01); *G02F 1/136286* (2013.01); *H01L 27/124* (2013.01); *G02F 2001/134345* (2013.01); *G02F 2001/136222* (2013.01)

(58) Field of Classification Search
None
See application file for complete search history.

(56) References Cited

U.S. PATENT DOCUMENTS 9,093,328 B2 *   7/2015  Yamazaki .......... H01L 27/1225
2005/0242401 A1 *  11/2005  Cho ................. G02F 1/136227
257/368

(Continued)

FOREIGN PATENT DOCUMENTS

CN   101540340 A       9/2009
CN   103824780 A  *    5/2014

(Continued)

OTHER PUBLICATIONS

First Office Action regarding Chinese Application No. 201510358095.9, dated Jul. 28, 2017. Translation provided by Dragon Intellectual Property Law Firm.

*Primary Examiner* — Telly Green
(74) *Attorney, Agent, or Firm* — Harness, Dickey & Pierce, P.L.C.

(57) ABSTRACT

A thin film transistor, an array substrate and a display device are provided by the present disclosure. The thin film transistor is on a base substrate, a profile of a width edge of the channel includes an up-and-down curved section in a direction perpendicular to a surface of the base substrate.

19 Claims, 6 Drawing Sheets

(51) Int. Cl.
   *G02F 1/1343*      (2006.01)
   *G02F 1/1362*      (2006.01)

(56) References Cited

U.S. PATENT DOCUMENTS

| | | | |
|---|---|---|---|
| 2007/0210257 A1* | 9/2007 | Masuda | G01T 1/2018 |
| | | | 250/370.09 |
| 2008/0105874 A1* | 5/2008 | Wang | H01L 27/12 |
| | | | 257/59 |
| 2011/0109351 A1* | 5/2011 | Yamazaki | H01L 27/1225 |
| | | | 327/109 |
| 2015/0333090 A1* | 11/2015 | Yamazaki | H01L 27/1225 |
| | | | 257/43 |
| 2016/0189611 A1* | 6/2016 | Jinta | G09G 3/2003 |
| | | | 345/690 |
| 2016/0351724 A1* | 12/2016 | Zhao | H01L 29/786 |
| 2016/0379534 A1* | 12/2016 | Yamazaki | G09G 3/003 |
| | | | 438/104 |

FOREIGN PATENT DOCUMENTS

| | | | |
|---|---|---|---|
| CN | 103824780 A | | 5/2014 |
| CN | 104576761 A | * | 4/2015 |
| CN | 104576761 A | | 4/2015 |

* cited by examiner

THIN FILM TRANSISTOR, ARRAY SUBSTRATE AND DISPLAY DEVICE

CROSS-REFERENCE TO RELATED APPLICATION

This application claims a priority to Chinese Patent Application No. 201510358095.9 filed on Jun. 25, 2015, the disclosures of which are incorporated in their entirety by reference herein.

TECHNICAL FIELD

The present disclosure relates to the field of liquid crystal display technology, and in particular to a thin film transistor, an array substrate and a display device.

BACKGROUND

Thin film transistor-liquid crystal display (TFT-LCD) has such advantages as small size, low power consumption and radiation-free, which has been developed rapidly at recent years and plays a leading role in the flat panel display market. An array substrate is a major structure of the TFT-LCD, including gate lines and data lines intersected to each other and configured to define a plurality of pixel areas. Each pixel area corresponds to a thin film transistor so as to control a display of the pixel area. The larger a width to length ratio (W/L) of a channel of the thin film transistor is, the larger a turn-on current may be, and then a performance of the thin film transistor may be better. In order to reduce an adversely influence on an aperture ratio, the thin film transistor is usually arranged on the gate line.

With development of the display technology, a requirement of resolution of a user is improving, such that a larger aperture ratio and a smaller thin film transistor are desired. For a small size thin film transistor, it is very difficult to realize a channel with a large width to length ratio, and thus a performance of the thin film transistor is adversely influenced.

SUMMARY

A thin film transistor is provided by the present disclosure, to increase a width to length ratio of a channel of the thin film transistor when an area of a projection of the thin film transistor is constant.

An array substrate and a display device are provided by the present disclosure, applying the thin film transistor hereinabove, to guarantee a display quality while improving the resolution ratio.

In order to solve the technical issue mentioned above, a thin film transistor is provided by the present disclosure, including patterns of a source electrode, a drain electrode and an active layer on a base substrate. A portion of the active layer between the source electrode and the drain electrode defines a channel. A profile of a width edge of the channel includes an up-and-down curved section in a direction perpendicular to a surface of the base substrate.

Optionally, the entire channel is up-and-down and curved in an extension direction of the width edge.

Optionally, the channel includes a portion parallel to the surface of the base substrate.

Optionally, thin film transistor further includes a protrusion structure on the base substrate; the width edge of the channel includes a curved section extending along a surface profile of the protrusion structure.

Optionally, the thin film transistor further includes a groove structure at the base substrate; the width edge of the channel includes a curved section extending along a surface profile of the groove structure.

Optionally, the channel includes a plurality of extension portions between the source electrode and the drain electrode; the plurality of extension portions are connected in sequence in the extension direction of the width edge of the channel with an angle defined between each adjacent two of the extension portions; the angle is not zero.

Optionally, each of the extension portions has a planar shape.

Optionally, the source electrode includes a plurality of extension portions; the plurality of extension portions of the source electrode are connected in sequence in the extension direction of the width edge of the channel with an angle defined between each adjacent two of the extension portions of the source electrode; the angle defined between each adjacent two of the extension portions of the source electrode is not zero; the drain electrode includes a plurality of extension portions; the plurality of extension portions of the drain electrode are connected in sequence in the extension direction of the width edge of the channel with an angle defined between each adjacent two of the extension portions of the drain electrode; the angle defined between each adjacent two of the extension portions of the drain electrode is not zero.

Furthermore, the thin film transistor further includes a gate electrode spaced from the source electrode and the drain electrode; the gate electrode includes a plurality of extension portions; the plurality of extension portions of the gate electrode are connected in sequence in the extension direction of the width edge of the channel with an angle defined between each adjacent two of the extension portions of the gate electrode; the angle defined between each adjacent two of the extension portions of the gate electrode is not zero.

Furthermore, each of the extension portions of the drain electrode, the extension portions of the source electrode and the extension portions of the gate electrode has a planar shape.

An array substrate is further provided by some embodiments of the present disclosure, including the thin film transistor hereinabove.

Optionally, the array substrate includes gate lines and data lines on a base substrate. The gate lines intersect the data lines to define sub-pixel regions; each of the sub-pixel regions includes a color filter layer through which light of a color is transmitted. The profile of the width edge of the channel of the thin film transistor includes a curved section extending along a surface profile of the color filter layer.

Optionally, each adjacent two of the color filter layers define a groove structure; the profile of the width edge of the channel of the thin film transistor includes a curved section extending along a surface profile of the groove structure.

Optionally, the thin film transistors are at intersections of the gate lines and the data lines; at each of the intersections of the gate lines and the data lines, the color filter layers includes two groups of first color filter layer and second color filter layer which are adjacent to each other in a column direction; the first color filter layer and the second color filter layer of one of the two groups define a first groove structure, and the first color filter layer and the second color filter layer of the other one of the two groups define a second groove structure; the channel of the thin film transistor includes two width edges; one of the two width edges of the channel includes a curved section extending along a surface profile of the first groove structure, and the other one of the two width edges of the channel includes a curved section extending along a surface profile of the second groove structure.

A display device is further provided by some embodiments of the present disclosure, including the array substrate hereinabove.

A thin film transistor is further provided by some embodiments of the present disclosure, including an active layer, a source electrode and a drain electrode which are overlap-jointed to two ends of the active layer. A portion of the active layer between the source electrode and the drain electrode defines a channel; the channel includes a plurality of extension portions between the source electrode and the drain electrode, and the plurality of extension portions are connected in sequence in an extension direction of a width edge of the channel with an angle defined between each adjacent two of the extension portions; the angle is not zero.

The technical solution of the present disclosure has the following advantages: the thin film transistor is on the base substrate, the profile of the width edge of the channel includes an up-and-down curved section in the direction perpendicular to the surface of the base substrate; in this way, in case that an area of a projection of the thin film transistor onto the base substrate is constant, a channel width of the thin film transistor is increased, then a large width to length ratio is obtained, and then a turn-on current is increased, thereby improving the performance of the thin film transistor, reducing a size of the thin film transistor, increasing the resolution ratio of the display device while guaranteeing the display quality.

BRIEF DESCRIPTION OF THE DRAWINGS

In order to illustrate the technical solutions of the present disclosure in a clearer manner, the drawings desired for the present disclosure will be described hereinafter briefly. Obviously, the following drawings merely relate to some embodiments of the present disclosure, and based on these drawings, a person skilled in the art may obtain the other drawings without any creative effort.

DETAILED DESCRIPTION

With an improving resolution ratio of the TFT-LCD, a larger aperture ratio and a smaller thin film transistor are desired. For a small size thin film transistor, it is very difficult to realize a channel with a large width to length ratio, and thus the performance of the thin film transistor is adversely influenced.

In view of this, a thin film transistor is provided in some embodiments of the present disclosure, including patterns of a source electrode, a drain electrode and an active layer arranged on a base substrate. A channel is defined by a portion of the active layer between the source electrode and the drain electrode. A profile of a width edge of the channel includes an up-and-down curved section in a direction perpendicular to a surface of the base substrate. In this way, in case that an area of a projection of the thin film transistor onto the base substrate is constant, a channel width of the thin film transistor is increased, then a large width to length ratio is obtained, and then a turn-on current is increased, thereby improving the performance of the thin film transistor.

Generally, in the thin film transistor, the source electrode is symmetric with the drain electrode. The channel width of the thin film transistor refers to a length of an edge profile (width edge) of a region where the active layer and the source electrode are overlapped adjacent to the drain electrode, or a length of an edge profile of a region where the active layer and the drain electrode are overlapped adjacent to the source electrode. A channel length of the thin film transistor refers to a length of a portion of the active layer between the source electrode and the drain electrode in a direction perpendicular to an extending direction of the width edge of the channel.

The present disclosure will be described hereinafter in conjunction with the drawings and embodiments. The following embodiments are for illustrative purposes only, but shall not be used to limit the scope of the present disclosure.

Figure 1:
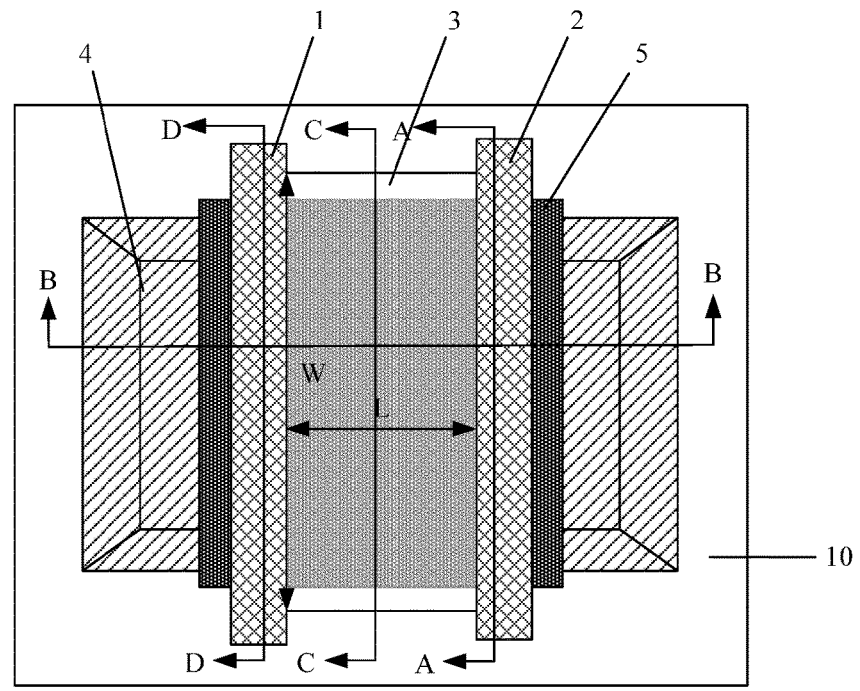
FIG. 1 is a schematic view of a thin film transistor in some embodiments of the present disclosure.
Figure 2:
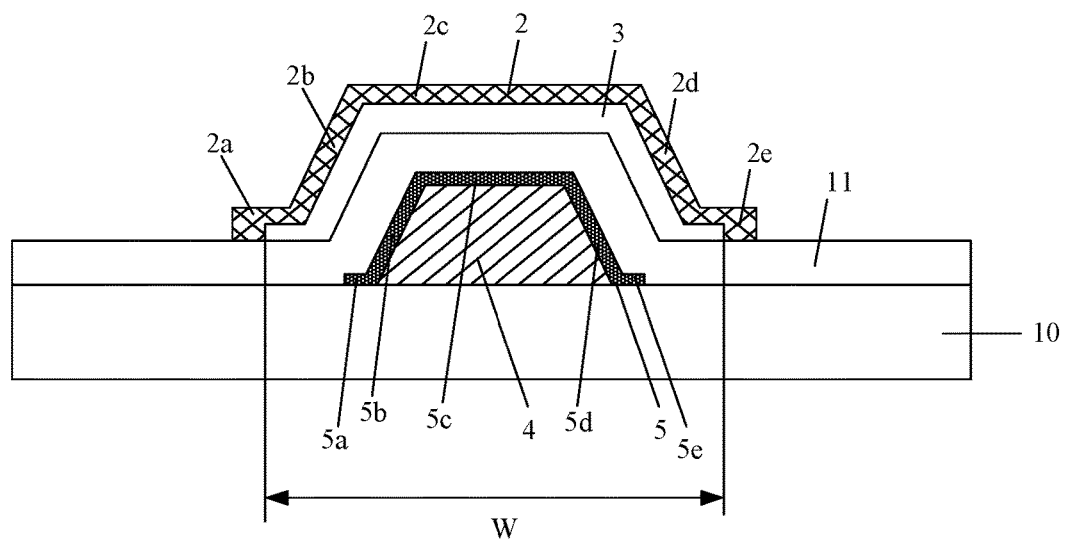
FIG. 2 is a sectional view of the thin film transistor in FIG. 1 taken along a line A-A.
Figure 3:
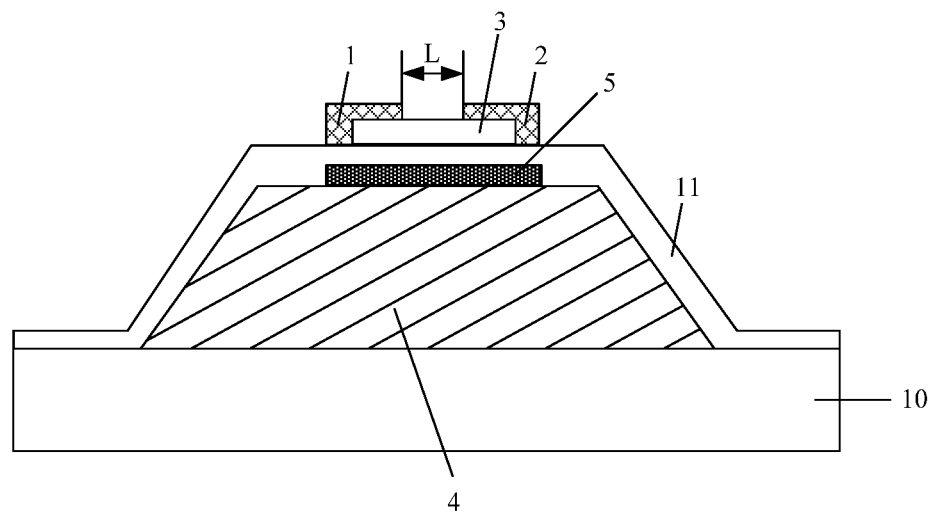
FIG. 3 is a sectional view of the thin film transistor in FIG. 1 taken along a line B-B.

FIGS. 1-3 are schematic views of a thin film transistor in some embodiments of the present disclosure.

Figure 4:
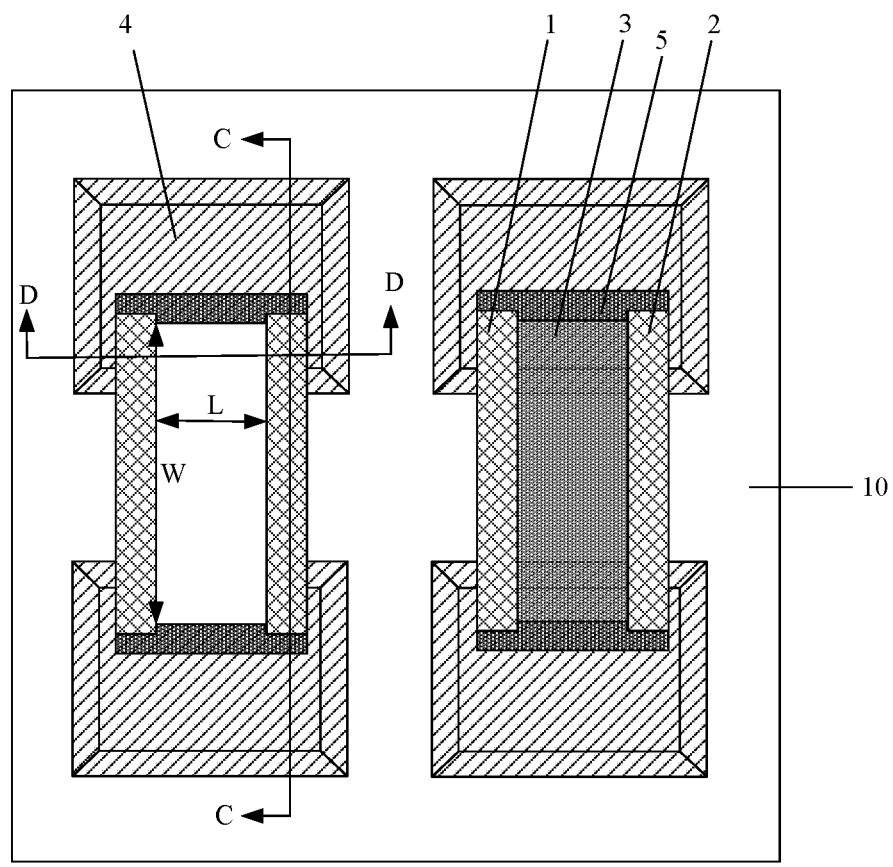
FIG. 4 is a schematic view of a thin film transistor in some embodiments of the present disclosure.
Figure 5:
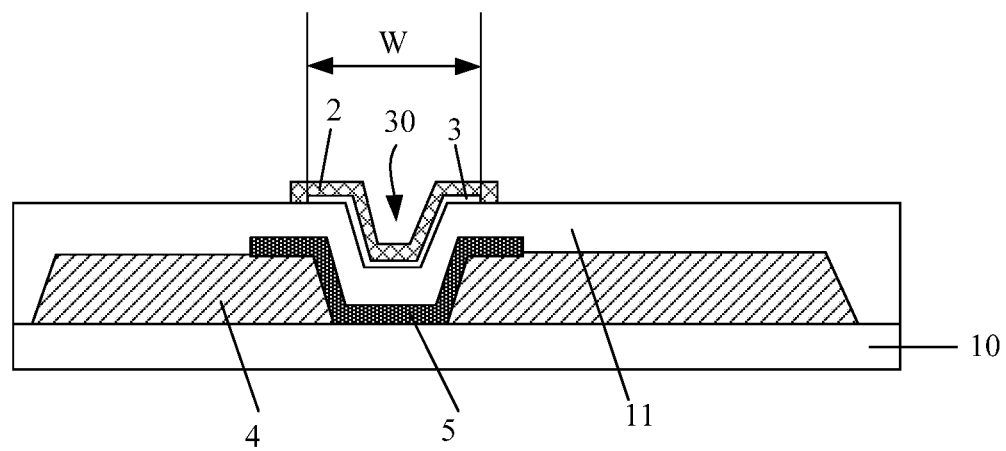
FIG. 5 is a sectional view of the thin film transistor in FIG. 4 taken along a line C-C.
Figure 6:
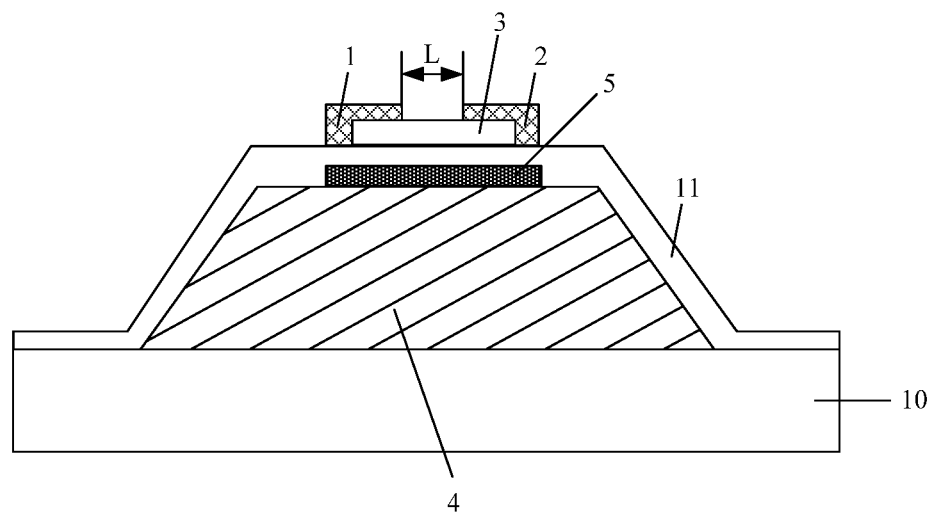
FIG. 6 is a sectional view of the thin film transistor in FIG. 4 taken along a line D-D.

FIGS. 4-6 are schematic views of another thin film transistor in some embodiments of the present disclosure.

As shown in FIGS. 1-6, W represents a channel width of the thin film transistor, and L represents a channel length of the thin film transistor.

Referring to FIGS. 1-6, a thin film transistor is provided in some embodiments of the present disclosure, including patterns of a source electrode 1, a drain electrode 2 and an active layer 3 arranged on a base substrate 10. A channel is defined by a portion of the active layer 3 between the source electrode 1 and the drain electrode 2. A profile of a width edge of the channel includes an up-and-down curved section in a direction perpendicular to a surface of the base substrate 10. In this way, in case that an area of a projection of the thin film transistor onto the base substrate 10 is constant, a channel width of the thin film transistor is increased, then a large width to length ratio is obtained, and then a turn-on current is increased, thereby improving the performance of the thin film transistor.

When the thin film transistor is applied to a display device, the base substrate 10 applies a transparent substrate such as glass substrate, quartz substrate or organic resin substrate so as not to adversely influence a normal display.

In the solution hereinabove, the profile of the width edge of the channel of the thin film transistor arranged on the base substrate is up-and-down and curved in the direction perpendicular to the surface of the base substrate. As a result, even if the thin film transistor is of a small size, a relatively large width to length ratio of the channel may be obtained, thereby ensuring the performance of the thin film transistor and improving the product quality. When the thin film transistor is applied to the display device, the display quality of the display device may be guaranteed while increasing a resolution ratio of the display device.

In some embodiments of the present disclosure, such words as "on" refers a direction perpendicular to the surface of the base substrate and away from the base substrate, and such words as "below" refers a direction perpendicular to the surface of the base substrate and closed to the base substrate.

Optionally, the entire channel of the thin film transistor is up-and-down and curved in an extension direction of the width edge of the channel, thereby further increasing the channel width.

Furthermore, the channel of the thin film transistor includes a portion parallel to the surface of the base substrate, so as to reduce the channel length, thereby obtaining a larger width to length ratio of the channel and improving the performance of the thin film transistor.

In some embodiments of the present disclosure, the profile of the width edge of the channel is arranged to have an up-and-down and curved section by arranging protrusion structures, groove structures or a combination thereof.

In some embodiments of the present disclosure, referring to FIGS. 1-3 and 10-11, the thin film transistor includes a protrusion structure 4 arranged on the base substrate 10. The width edge of the channel of the thin film transistor includes a curved section extending along a surface profile of the protrusion structure 4.

Optionally, the entire channel of the thin film transistor is arranged on the protrusion structure 4. The entire channel is up-and-down and curved in the extension direction of the width edge.

Figure 10:
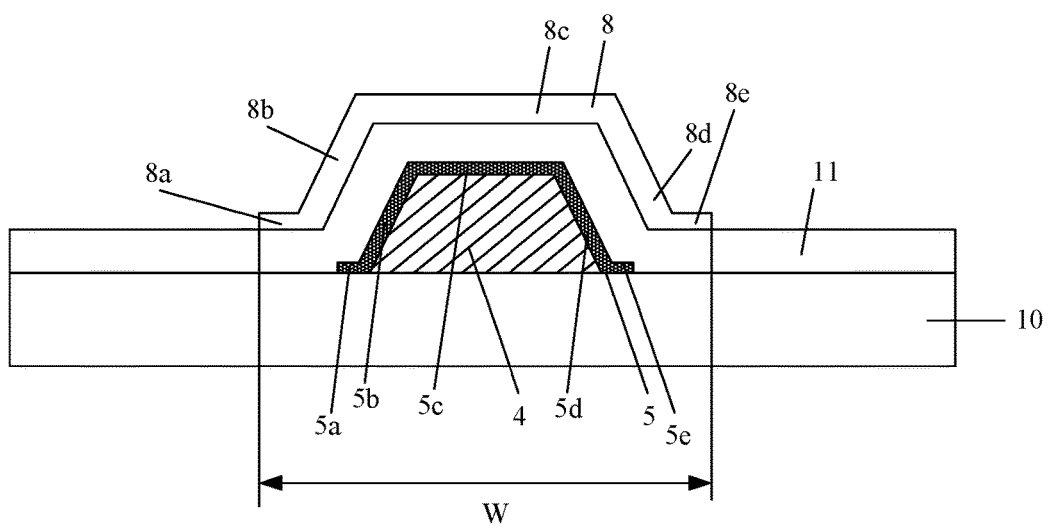
FIG. 10 is a sectional view of the thin film transistor in FIG. 1 taken along a line C-C.
Figure 11:
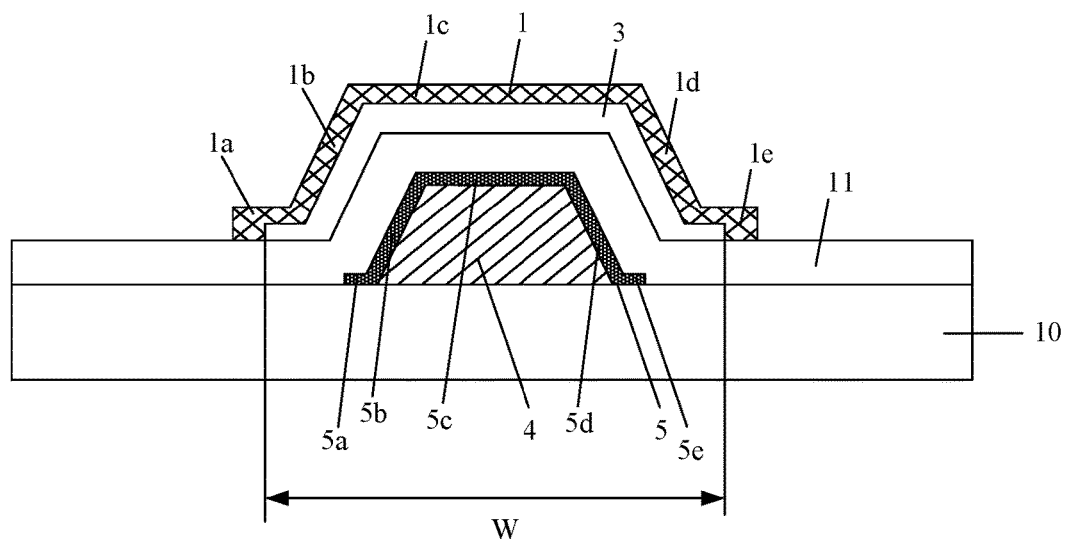
FIG. 11 is a sectional view of the thin film transistor in FIG. 1 taken along a line D-D.

As shown in FIG. 11, the source electrode 1 includes extension portions 1a, 1b, 1c, 1d and 1e, which are connected in sequence in the extension direction of the width edge of the channel with a non-zero angle defined between each adjacent two of the extension portions. As shown in FIG. 2, the drain electrode 2 includes extension portions 2a, 2b, 2c, 2d and 2e, which are connected in sequence in the extension direction of the width edge of the channel with a non-zero angle defined between each adjacent two of the extension portions. As shown in FIGS. 2, 10 and 11, the gate electrode 5 includes extension portions 5a, 5b, 5c, 5d and 5e, which are connected in sequence in the extension direction of the width edge of the channel with a non-zero angle defined between each adjacent two of the extension portions. Further, as shown in FIG. 10, the channel 8 includes extension portions 8a, 8b, 8c, 8d and 8e, which are connected in sequence in the extension direction of the width edge of the channel 8 with a non-zero angle defined between each adjacent two of the extension portions.

In order to increase the width to length ratio of the channel, in practical process, a relatively small channel length may be obtained by arranging the entire channel of the thin film transistor to be plane in a direction perpendicular to the width edge without being up-and-down or curved. In some embodiments of the present disclosure, a portion of a surface of the protrusion structure 4 is parallel to the surface of the base substrate 10, and thus a portion of the channel arranged on the portion of the surface of the base substrate 10 is also parallel to the surface of the base substrate 10. In this way, the influence of the protrusion structure 4 to the channel length is reduced and the width to length ratio is relatively large.

In some embodiments of the present disclosure, referring to FIGS. 4-6, the thin film transistor includes a groove structure 30 arranged at the base substrate 10. The width edge of the channel includes a curved section extending along a surface profile of the groove structure 30. The groove structure 30 may be provided by arranging two protrusion structures 4 on the base substrate 10 with the groove structure 30 defined between the two protrusion structures 4.

Optionally, the entire channel of the thin film transistor is arranged at the groove structure 30. The entire channel is up-and-down and curved in the extension direction of the width edge.

In order to increase the width to length ratio of the channel, in practical process, a relatively small channel length may be obtained by arranging the entire channel of the thin film transistor to be plane in a direction perpendicular to the width edge without being up-and-down or curved. In some embodiments of the present disclosure, a portion of a bottom of the groove structure 30 is parallel to the surface of the base substrate 10, and then a portion of the channel arranged on the portion of the bottom of the groove structure 30 is also parallel to the surface of the base substrate 10. In this way, the influence of the groove structure 30 to the channel length is reduced and the width to length ratio is relatively large.

In order not to adversely influence the performance of the thin film transistor, the protrusion structure 4 may be made of insulating material such as silicon nitride, silicon oxide or silicon oxynitride. The protrusion structure 4 may be of a single-layer structure or a multiple-layers structure.

Figure 7:
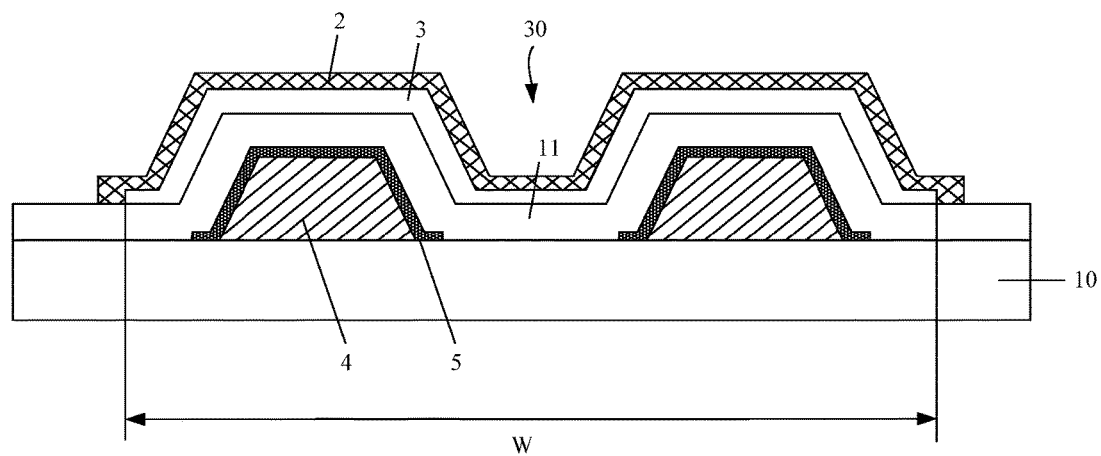
FIG. 7 is a sectional view of a portion of the thin film transistor in some embodiments of the present disclosure.

Optionally, the thin film transistor includes a plurality of (e.g., two) protrusion structures 4. The width edge of the channel includes a curved section extending along a surface profile of the protrusion structures 4. As shown in FIG. 7, W represents the channel width of the thin film transistor. Since the groove structure 30 is arranged between the adjacent protrusion structures 4, thus, it is equivalent to combine the protrusion structures 4 and the groove structure 30 to make the profile of the width edge of the channel up-and-down and curved. In addition, the entire channel of the thin film transistor may be arranged on the protrusion structures 4 and the groove structure 30 between the protrusion structures 4. Then, the entire channel is up-and-down and curved in the extension direction of the width edge. Portions of the surfaces of the protrusion structures 4 are parallel to the surface of the base substrate 10, and a portion of the bottom of the groove structure 30 is also parallel to the surface of the base substrate 10, such that a width to length ratio of the channel may be relatively large.

In practical process, the protrusion structures or the groove structure may not be arranged independently. Instead, the active layer 3 may be patterned to form at least one protrusion pattern on the surface of the active layer 3, so as to make the profile of width edge of the channel up-and-down and curved, thereby increasing the channel width.

Referring to FIGS. 4-6, taking a bottom-gate thin film transistor as an example, the thin film transistor in some embodiments of the present disclosure includes: a base substrate 10, four protrusion structures 4 arranged in an array on the base substrate 10, a groove structure 30 defined between each pair of two protrusion structures 4 adjacent in a column direction, gate electrodes 5 arranged on each pair of two protrusion structures 4 adjacent in the column direction, a gate insulating layer 11 covering the gate electrodes 5, an active layer 3 arranged on the gate insulating layer 11, a source electrode 1 and a drain electrode 2. The source electrode 1 and the drain electrode 2 are overlap-jointed to two ends of the active layer 3. A channel is defined by a portion of the active layer 3 between the source electrode 1 and the drain electrode 2. Profiles of the two width edges of the channel each includes a curved section extending along the surface profile of the groove structure 30.

It should be noted that, FIGS. 1-7 merely show a sectional view of the width edge closed to the drain electrode 2. The sectional view of the width edge closed to the source electrode 1 is the same as the sectional view of the width edge closed to the drain electrode 2, and will not be repeated here.

An array substrate is further provided by some embodiments of the present disclosure, including the thin film transistor hereinabove. In this way, even if the thin film transistor is of a small size, a relatively large width to length ratio of the channel may be obtained, thereby ensuring the performance of the thin film transistor and improving product quality.

For the TFT-LCD, the array substrate includes gate lines and data lines which are arranged on a base substrate. The gate lines are intersected with the data lines to define sub-pixel regions.

Each sub-pixel region on a TFT-array substrate which adopts color filter on array (COA) technology further includes a color filter layer through which light of a color is transmitted. As a result, the problem that there is a deviation of the alignment between an array substrate and a color filter substrate when the color filter substrate (on which a color filter layer is arranged) is arranged independently, can be solved and then the aperture ratio can be improved.

For the COA array substrate, in some embodiments of the present disclosure, the protrusion structure is formed by the color filter layer, such that the width edge of the channel includes a curved section extending along a surface profile of the color filter layer. Alternatively, the groove structure is formed by the color filter layers of adjacent sub-pixel regions, such that the width edge of the channel includes a curved section extending along a surface profile of the groove structure. Then, the profile of the width edge of the channel includes an up-and-down curved section in the direction perpendicular to the surface of the base substrate, thereby increasing the length of width edge of the channel, providing a larger turn-on current, improving the performance of the thin film transistor, improving the resolution ratio of the display device and guaranteeing the display quality.

Optionally, the thin film transistors are arranged at intersections of the gate lines and the data lines, so as to reduce the adverse influence to the aperture ratio.

Furthermore, two groups of first color filter layer and second color filter layer which are adjacent to each other in a column direction are arranged at each of the intersections of the gate lines and the data lines. A first groove structure is defined between the first color filter layer and the second color filter layer of one of the groups. A second groove structure is defined between the first color filter layer and the second color filter layer of the other one of the groups.

Furthermore, one of the width edges of the channel of the thin film transistor includes a curved section extending along a surface profile of the first groove structure, and the other one of the width edges of the channel of the thin film transistor includes a curved section extending along a surface profile of the second groove structure. In this way, with the help of existing structures of the array substrate without adding additional structure, the channel width is increased, then the width to length ratio is increased, and then the performance as well as the product quality of the thin film transistor is improved.

Figure 8:
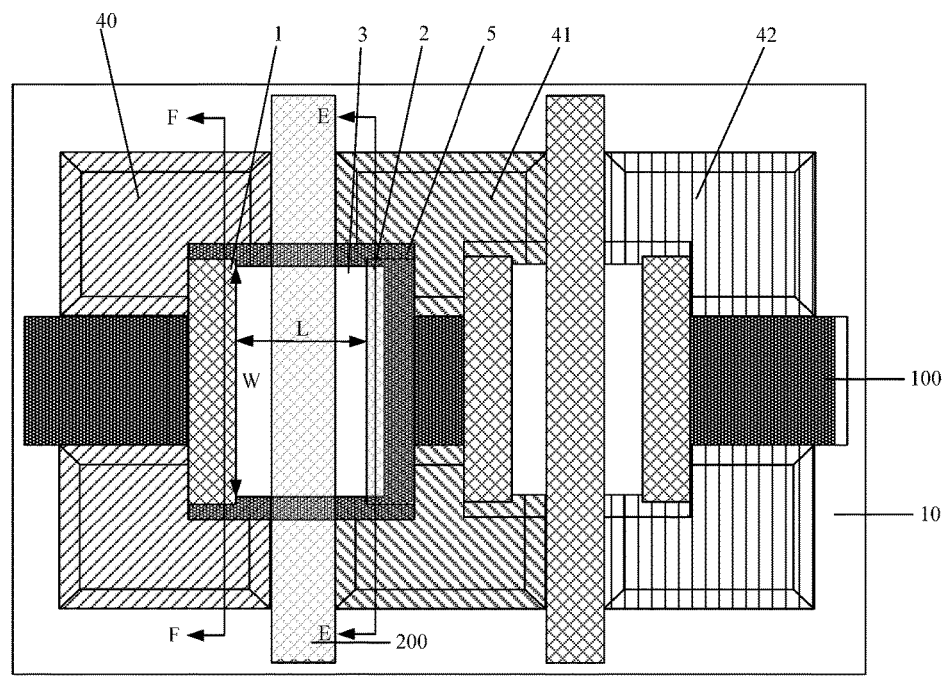
FIG. 8 is a schematic view of a thin film transistor array substrate in some embodiments of the present disclosure.
Figure 9:
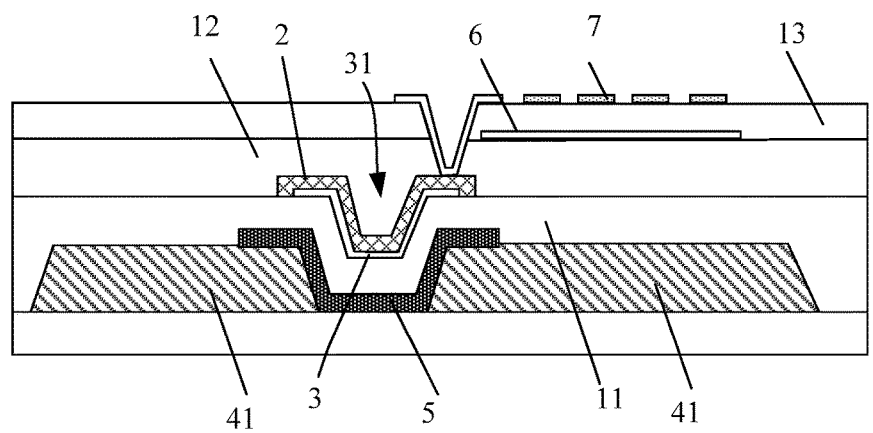
FIG. 9 is a sectional view of the array substrate in FIG. 8 taken along a line E-E.

Referring to FIG. 8 and FIG. 9, taking a bottom-gate thin film transistor array substrate as an example, the array substrate in some embodiments of the present disclosure includes a base substrate 10, gate lines 100 and data lines 200. The gate lines 100 and the date lines 200 are on the base substrate 10 and define a plurality of sub-pixel regions. The base substrate is a transparent substrate such as glass substrate, quartz substrate or organic resin substrate.

Each sub-pixel region includes a color filter layer, a thin film transistor arranged at each of the intersections of the gate lines and the data lines, and a passivation layer 12 covering the thin film transistor. The color filter layer includes red color filter layers 40, green color filter layers 41 and blue color filter layers 42. A first groove structure 32 is defined between adjacent two red color filter layers 40. A second groove structure 31 is defined between adjacent two green color filter layers 41. A third groove structure is defined between adjacent two blue color filter layers 42.

Each thin film transistor includes gate electrodes 5, a gate insulating layer 11 covering the gate electrodes 5, an active layer 3 arranged on the gate insulating layer 11, a source electrode 1 and a drain electrode 2. The gate electrodes 5 are arranged on adjacent four color filter layers. The four color filter layers include two red color filter layers 40 adjacent in the column direction and two green color filter layers 41 adjacent in the column direction, or two green color filter layers 41 adjacent in the column direction and two blue color filter layers 42 adjacent in the column direction. The gate insulating layer 11 may be made of silicon nitride, silicon oxide or silicon oxynitride. The source electrode 1 and the drain electrode 2 are overlap-jointed to two ends of the active layer 3.

Figure 12:
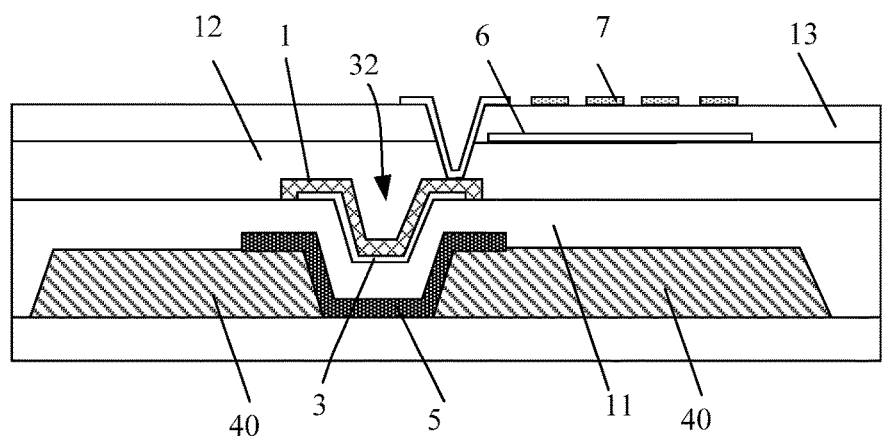
FIG. 12 is a sectional view of the array substrate in FIG. 8 taken along a line F-F.

A channel is defined by a portion of the active layer 3 between the source electrode 1 and the drain electrode 2. The profile of one of the two width edges of the channel includes a curved section extending along the surface profile of the first groove structure 32 (as shown in FIG. 12), and the profile of the other one of the two width edges of the channel includes a curved section extending along the surface profile of the second groove structure 31 (as shown in FIG. 9), or, the profile of one of the two width edges of the channel includes a curved section extending along the surface profile of the second groove structure, and the profile of the other one of the two width edges of the channel includes a curved section extending along the surface profile of the third groove structure.

Each sub-pixel region further includes a plate-like common electrode 6 arranged on the passivation layer 12, and a slot-like pixel electrode 7 arranged on the common electrode 6.

The common electrode 6 and the pixel electrode 7 are both transparent conductive layers, such as indium tin oxide or indium zinc oxide. An interlayer insulating layer 13 is arranged between the common electrode 6 and the pixel electrode 7. The pixel electrode 7 is electrically connected to the drain electrode 2 of the thin film transistor via a via-hole extending through the passivation layer 12 and the interlayer insulating layer 13.

The gate electrode 5 of the thin film transistor is electrically connected to the gate line 100, and the source electrode 1 of the thin film transistor is electrically connected to the data line 200. To be specific, the gate electrode 5 and the gate line 100 may be an integral structure formed by pattering one gate metal layer. The source electrode 1, the drain electrode 2 and the data line 200 may be an integral structure formed by patterning one source-drain metal layer. The gate metal layer and the source-drain metal layer may be made of Cu, Al, Ag, Mo, Cr, Nd, Ni, Mn, Ti, Ta, W or an alloy thereof, may be of a single-layer structure or a multi-layers structure. For example, the multi-players structure may be Cu/Mo, Ti/Cu/Ti, Mo/Al/Mo. The active layer 3 of the thin film transistor may be made of silicon semiconductor or metal-oxide semiconductor.

A display device is further provided by some embodiments of the present disclosure, including the array substrate hereinabove, so as to guarantee the performance of the thin film transistor and improve the display quality while increasing the resolution ratio of the product.

The above are merely the preferred embodiments of the present disclosure. A person skilled in the art may make further improvements and replacements without departing from the principle of the present disclosure, and these improvements and replacements shall also fall within the scope of the present disclosure.

What is claimed is:

1. A thin film transistor, comprising patterns of a source electrode, a drain electrode and an active layer on a base substrate;
    wherein a portion of the active layer between the source electrode and the drain electrode defines a channel, and a profile of a width edge of the channel comprises an up-and-down curved section in a direction perpendicular to a surface of the base substrate;
    wherein the thin film transistor further comprises a protrusion structure on the base substrate, and the width edge of the channel comprises a curved section extending along a surface profile of the protrusion structure; and
    wherein the protrusion structure is formed of a color filter layer configured to transmit light rays having a certain color.

2. The thin film transistor according to claim 1, wherein the entire channel is up-and-down and curved in an extension direction of the width edge.

3. The thin film transistor according to claim 1, wherein the channel comprises a portion parallel to the surface of the base substrate.

4. The thin film transistor according to claim 1, further comprising a groove structure at the base substrate; wherein the width edge of the channel comprises a curved section extending along a surface profile of the groove structure.

5. The thin film transistor according to claim 1, wherein the channel comprises a plurality of extension portions between the source electrode and the drain electrode; the plurality of extension portions are connected in sequence in the extension direction of the width edge of the channel with an angle defined between each adjacent two of the extension portions; the angle is not zero.

6. The thin film transistor according to claim 5, wherein each of the extension portions has a planar shape.

7. The thin film transistor according to claim 5, wherein the source electrode comprises a plurality of extension portions; the plurality of extension portions of the source electrode are connected in sequence in the extension direction of the width edge of the channel with an angle defined between each adjacent two of the extension portions of the source electrode; the angle defined between each adjacent two of the extension portions of the source electrode is not zero;
    the drain electrode comprises a plurality of extension portions; the plurality of extension portions of the drain electrode are connected in sequence in the extension direction of the width edge of the channel with an angle defined between each adjacent two of the extension portions of the drain electrode; the angle defined between each adjacent two of the extension portions of the drain electrode is not zero.

8. The thin film transistor according to claim 7, further comprising a gate electrode spaced from the source electrode and the drain electrode; wherein the gate electrode comprises a plurality of extension portions; the plurality of extension portions of the gate electrode are connected in sequence in the extension direction of the width edge of the channel with an angle defined between each adjacent two of the extension portions of the gate electrode; the angle defined between each adjacent two of the extension portions of the gate electrode is not zero.

9. The thin film transistor according to claim 8, wherein each of the extension portions of the drain electrode, the extension portions of the source electrode and the extension portions of the gate electrode has a planar shape.

10. An array substrate, comprising the thin film transistor according to claim 1.

11. The array substrate according to claim 10, comprising gate lines and data lines which are on a base substrate;
    wherein the gate lines intersect the data lines to define sub-pixel regions; each of the sub-pixel regions comprises a color filter layer through which light of a color is transmitted;
    wherein the profile of the width edge of the channel of the thin film transistor comprises a curved section extending along a surface profile of the color filter layer.

12. The array substrate according to claim 11, wherein each adjacent two of the color filter layers define a groove structure; the profile of the width edge of the channel of the thin film transistor comprises a curved section extending along a surface profile of the groove structure.

13. The array substrate according to claim 12, wherein the thin film transistors are at intersections of the gate lines and the data lines;
    at each of the intersections of the gate lines and the data lines, the color filter layers comprises two groups of first color filter layer and second color filter layer which are adjacent to each other in a column direction; the first color filter layer and the second color filter layer of one of the two groups define a first groove structure, and the first color filter layer and the second color filter layer of the other one of the two groups define a second groove structure;
    the channel of the thin film transistor comprises two width edges; one of the two width edges of the channel comprises a curved section extending along a surface profile of the first groove structure, and the other one of the two width edges of the channel comprises a curved section extending along a surface profile of the second groove structure.

14. A display device comprising the array substrate according to claim 10.

15. A thin film transistor, comprising an active layer, a source electrode and a drain electrode which are overlap-jointed to two ends of the active layer;
    wherein a portion of the active layer between the source electrode and the drain electrode defines a channel, the channel comprises a plurality of extension portions between the source electrode and the drain electrode, the plurality of extension portions are connected in sequence in an extension direction of a width edge of the channel with an angle defined between each adjacent two of the extension portions, and the angle is not zero;

wherein the thin film transistor further comprises a protrusion structure on the base substrate, and the width edge of the channel comprises a curved section extending along a surface profile of the protrusion structure; and wherein the protrusion structure is formed of a color filter layer configured to transmit light rays having a certain color.

16. The thin film transistor according to claim 15, wherein each of the extension portions has a planar shape.

17. The thin film transistor according to claim 15, wherein the source electrode comprises a plurality of extension portions; the plurality of extension portions of the source electrode are connected in sequence in the extension direction of the width edge of the channel with an angle defined between each adjacent two of the extension portions of the source electrode; the angle defined between each adjacent two of the extension portions of the source electrode is not zero;

the drain electrode comprises a plurality of extension portions; the plurality of extension portions of the drain electrode are connected in sequence in the extension direction of the width edge of the channel with an angle defined between each adjacent two of the extension portions of the drain electrode; the angle defined between each adjacent two of the extension portions of the drain electrode is not zero.

18. The thin film transistor according to claim 17, further comprising a gate electrode spaced from the source electrode and the drain electrode; wherein the gate electrode comprises a plurality of extension portions; the plurality of extension portions of the gate electrode are connected in sequence in the extension direction of the width edge of the channel with an angle defined between each adjacent two of the extension portions of the gate electrode; the angle defined between each adjacent two of the extension portions of the gate electrode is not zero.

19. The thin film transistor according to claim 18, wherein each of the extension portions of the drain electrode, the extension portions of the source electrode and the extension portions of the gate electrode has a planar shape.

* * * * *